(12) United States Patent  
Wu

(10) Patent No.: US 7,986,558 B2  
(45) Date of Patent: Jul. 26, 2011

(54) METHOD OF OPERATING NON-VOLATILE MEMORY CELL AND MEMORY DEVICE UTILIZING THE METHOD

(75) Inventor: Chao-I Wu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 337 days.

(21) Appl. No.: 12/326,283

(22) Filed: Dec. 2, 2008

(65) Prior Publication Data

US 2010/0135086 A1    Jun. 3, 2010

(51) Int. Cl.  
*G11C 11/34* (2006.01)

(52) U.S. Cl. .......... 365/185.18; 365/185.19; 365/185.29

(58) Field of Classification Search ............. 365/185.18, 365/185.19, 185.29  
See application file for complete search history.

(56) References Cited

U.S. PATENT DOCUMENTS

| | | | |
|---|---|---|---|
| 6,483,752 B2 * | 11/2002 | Hirano | 365/185.33 |
| 2003/0103381 A1 * | 6/2003 | Han et al. | 365/185.24 |
| 2003/0218913 A1 * | 11/2003 | Le et al. | 365/185.33 |

* cited by examiner

*Primary Examiner* — Son T Dinh  
(74) *Attorney, Agent, or Firm* — J.C. Patents

(57) ABSTRACT

A method of operating a non-volatile memory cell is described, including pre-erasing the cell through double-side biased (DSB) injection of a first type of carrier and programming the cell through Fowler-Nordheim (FN) tunneling of a second type of carrier.

14 Claims, 1 Drawing Sheet

METHOD OF OPERATING NON-VOLATILE MEMORY CELL AND MEMORY DEVICE UTILIZING THE METHOD

BACKGROUND OF THE INVENTION

1. Field of the Invention

This invention relates to semiconductor devices, and more particularly relates to a method of operating a non-volatile memory (NVM) and to a memory device utilizing the method.

2. Description of the Related Art

Nonvolatile memory has been widely used in many electronic products, wherein the most populated non-volatile memory devices are those having a charge storage layer and being written and erased electrically, such as EEPROM and flash memory.

Such a non-volatile memory is formed based on a bulk semiconductor substrate conventionally, with the charge storage layer disposed between a control gate and the substrate. Recently, nonvolatile memory formed based on a thin semiconductor film with the thin-film transistor (TFT) technology has been provided, wherein each cell is a thin-film transistor. By utilizing the TFT technology, it is possible to repeatedly form a semiconductor film and a layer of TFT cells based thereon and thereby fabricate a 3D non-volatile memory array.

A non-volatile memory cell of TFT type is conventionally programmed through positive Fowler-Nordheim (+FN) electron tunneling into the charge storage layer and erased by ejecting electrons out of the charge storage layer. For the efficiency of +FN programming is lower, the programming time required is longer generating more heat. This makes the operating method unsuitable to a 3D non-volatile memory array because a 3D memory array particularly suffers from difficult heat dissipation in the prior art.

SUMMARY OF THE INVENTION

In view of the foregoing, this invention provides a method of operating a non-volatile memory cell, which has a higher programming efficiency reducing the program time and heat generation and is therefore suitable for a 3D non-volatile memory.

This invention also provides a memory device utilizing the operating method of this invention.

The method of operating a non-volatile memory cell of this invention is described as follows. The cell is pre-erased through double-side biased (DSB) injection of a first type of carrier, and is programmed through Fowler-Nordheim (FN) tunneling of a second type of carrier.

The memory device of this invention includes a memory cell, a first logic for pre-erasing the memory cell through DSB injection of a first type of carrier, and a second logic for programming the memory cell through FN tunneling of a second type of carrier.

In an embodiment, the DSB injection utilized to pre-erase the cell includes DSB band-to-band tunneling hot carrier injection.

In an embodiment, the FN tunneling utilized to program the cell includes positive FN (+FN) tunneling.

In an embodiment, the first type of carrier is electric hole and the second type of carrier is electron.

In an embodiment, the cell includes a semiconductor layer, a charge storage layer and a control gate over the same, and a source and a drain in the same. The DSB injection may be caused by applying a first voltage to the control gate and a second voltage to the source and the drain, wherein the first voltage is sufficiently different from the second voltage. The +FN tunneling may be caused by applying a third voltage to the control gate and a fourth voltage to the source and the drain in a reversed polarity of the first voltage to the second voltage in the DSB injection, wherein the third voltage is sufficiently different from the fourth voltage.

In addition, the semiconductor layer may be a floating body disposed on an insulator. In such a case, it is possible that the memory cell is a thin-film transistor (TFT), the semiconductor layer and the control gate both include doped silicon and the charge storage layer includes a nitride layer between two oxide layers, so that the memory cell is a TFT silicon-oxide-nitride-oxide-silicon (SONOS) cell.

Since in this invention the memory cell is programmed with FN tunneling after being pre-erased with DSB injection, the programming efficiency is raised due to the charges of the opposite sign in the charge storage layer so that the time required for the programming is reduced. Moreover, because less heat is produced due to the shorter programming time, the operating method of this invention is particularly suitable for a 3D-memory array that suffers from the heat dissipation issue in the prior art.

It is to be understood that both the foregoing general description and the following detailed description are exemplary, and are intended to provide further explanation of the invention as claimed.

DESCRIPTION OF THE PREFERRED EMBODIMENTS

Figure 1:
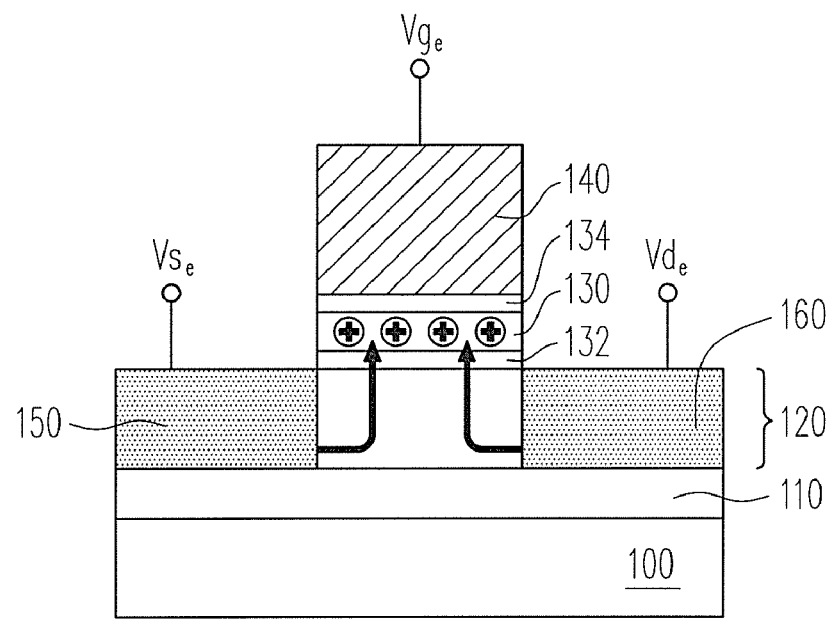
FIG. 1 illustrates the pre-erasing step in a method of operating a non-volatile memory cell according to an embodiment of this invention.
Figure 2:
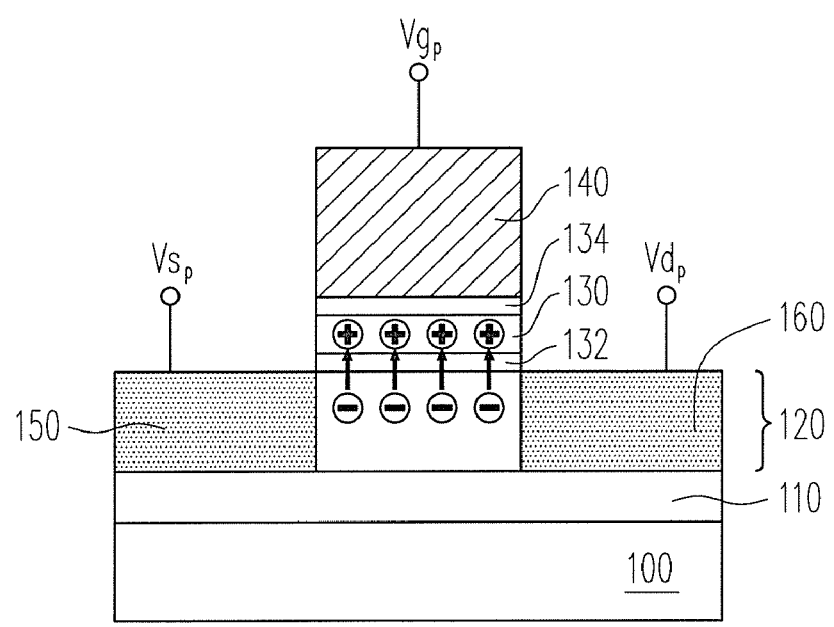
FIG. 2 illustrates the programming step in a method of operating a non-volatile memory cell according to an embodiment of this invention.

FIGS. 1 and 2 respectively illustrate the pre-erasing step and programming step in a method of operating a non-volatile memory cell according to an embodiment of this invention.

Referring to FIG. 1, the non-volatile memory cell includes a semiconductor layer 120 as a floating body disposed on an insulator 110 on a substrate 100, a charge storage layer 130 over the semiconductor layer 120, a control gate 140 over the charge storage layer 130, and a source region 150 and a drain region 160 in the semiconductor layer 120 beside the control gate 140.

The substrate 100 may be a silicon substrate. The insulator 110 may be a silicon oxide layer that is usually formed by CVD. The semiconductor layer 120 may be a doped polysilicon film formed by LPCVD. The charge storage layer 130 may be a charge trapping layer, which is usually a silicon nitride (SiN) layer between a bottom oxide layer 132 and a top oxide layer 134. The control gate 140 may include doped polysilicon. When the semiconductor layer 120 and control gate 140 include doped polysilicon and the charge storage layer 130 is a SiN trapping layer two oxide layers 132 and 134, the memory cell is a TFT SONOS cell.

In addition, it is possible that the semiconductor layer 120 under the control gate 140 is P-doped and the source region 150 and the drain region 160 are N-doped so that the cell is an N-type transistor, which is taken as an example in the descriptions below.

Referring to FIG. 1 again, in the pre-erasing step, a first voltage $Vg_e$ is applied to the control gate 140 and a second voltage $Vs_e$ ($=Vd_e$) to the source region 150 and the drain region 160 (double-side biased, DSB), wherein $Vg_e$ is sufficiently lower than $Vs_e$ ($Vd_e$) such that band-to-band tunneling hot hole (BTBTHH) injection into the charge storage layer 130 is caused. For example, the first voltage is lower than 0V and the second voltage higher than 0V. In such a case, it is possible that $Vg_e$ ranges from −10 V to −20 V and $Vs_e$ ($=Vd_e$) ranges from 8 V to 12 V. In a specific embodiment, $Vg_e$ is about −15V and $Vs_e$ ($=Vd_e$) about 10V.

Referring to FIG. 2, in the programming step, a third voltage $Vg_p$ is applied to the control gate 140 and a fourth voltage $Vs_p$ ($=Vd_p$) is applied to the source region 150 and the drain region 160, wherein $Vg_p$ is sufficiently higher than $Vs_p$ ($Vd_p$) such that +FN tunneling of electrons into the charge storage layer is caused. For example, $Vs_p$ ($=Vd_p$) is 0V and the third voltage is higher than 0V. In such a case, $Vg_p$ may range from 15 V to 20 V. In a specific embodiment, $Vg_p$ is about 20V.

On the other hand, the memory device according to this embodiment includes a memory cell as shown in FIG. 1/2, a first logic for pre-erasing the memory cell through DSB BTBTHH injection as in FIG. 1, and a second logic for programming the memory cell through +FN tunneling of electrons as in FIG. 2. The first logic might apply the above bias configuration for pre-erasing. The second logic might apply the above bias configuration for programming.

It is particularly noted that though this invention is exemplified by the operation of a TFT-type non-volatile memory cell in the embodiment, the operating method of this invention is also applicable to many other types of non-volatile memory cells having a charge storage layer, a control gate and source/drain regions, in consideration of the mechanisms of the DSB programming and FN-tunneling erasing. That is, the memory cell in the memory device of this invention is not limited to be a TFT-type NVM cell, but may alternatively be one of many other types of NVM cells.

Since in this embodiment the memory cell is programmed with electron FN tunneling after being pre-erased with DSB hole injection, the programming efficiency is raised due to the positive charge in the charge storage layer so that the time required for programming is reduced. Moreover, because less heat is produced due to the shorter programming time, the operating method of this invention is particularly suitable for a 3D-memory array that suffers from the heat dissipation issue in the prior art.

Furthermore, though the first type of carrier is electric hole, the second type of carrier is electron, the DSB injection includes DSB BTBTHH injection and the FN tunneling includes +FN tunneling of electrons in the above embodiment, this invention is not limited to the combination. In another embodiment, for example, the $1^{st}$ type of carrier is electron, the $2^{nd}$ type of carrier is electric hole, the DSB injection includes DSB electron injection and the FN tunneling includes FN tunneling of electric holes.

This invention has been disclosed above in the embodiments, but is not limited thereto. It is known to those of ordinary skill in the art that some modifications and innovations may be made without departing from the spirit and scope of this invention. Hence, the scope of this invention should be defined by the following claims.

What is claimed is:

1. A method of operating a non-volatile memory cell, comprising:
    the cell comprises a semiconductor layer, a charge storage layer and a control gate over the semiconductor layer, and a source and a drain in the semiconductor layer;
    pre-erasing the cell, by applying only one first voltage of −10 V to −20 V to the control gate and only one second voltage of 8 V to 12V to the source and the drain, wherein the first voltage is different from the second voltage such that double-side biased (DSB) injection of a first type of carrier into the charge storage layer is caused; and
    programming the cell through Fowler-Nordheim (FN) tunneling of a second type of carrier.

2. The method of claim 1, wherein the DSB injection comprises DSB band-to-band tunneling hot arrier injection.

3. The method of claim 1, wherein the FN tunneling comprises positive FN (+FN) tunneling.

4. The method of claim 1, wherein the first type of carrier is electric hole and the second type of carrier is electron.

5. The method of claim 1, wherein
    in programming the cell, a third voltage is applied to the control gate and a fourth voltage to the source and the drain, wherein the third voltage is different from the fourth voltage such that FN tunneling of the second type of carrier into the charge storage layer is caused.

6. The method of claim 5, wherein the third voltage is higher than 0V and the fourth voltage is 0V.

7. The method of claim 6, wherein the third voltage ranges from 15 V to 20 V.

8. The method of claim 1, wherein the semiconductor layer is a floating body disposed on an insulator.

9. The method of claim 8, wherein the memory cell is a thin-film transistor (TFT), the semiconductor layer and the control gate both comprise doped silicon, and the charge storage layer comprises a nitride layer between two oxide layers, so that the memory cell is a TFT SONOS cell.

10. A memory device, comprising:
    a memory cell;
    a first logic for pre-erasing the memory cell through double-side biased (DSB) injection of a first type of carrier; and
    a second logic for programming the memory cell through Fowler-Nordheim (FN) tunneling of a second type of carrier.

11. The memory device of claim 10, wherein the first type of carrier is electric hole and the second type of carrier is electron.

12. The memory device of claim 10, wherein the DSB injection comprises DSB band-to-band tunneling hot carrier injection.

13. The memory device of claim 10, wherein the FN tunneling comprises positive FN (+FN) tunneling.

14. The memory device of claim 10, wherein the first type of carrier is electric hole, the second type of carrier is electron, the DSB injection comprises DSB band-to-band tunneling hot hole injection, and the FN tunneling comprises positive FN (+FN) tunneling of electrons.

* * * * *